United States Patent
Laming et al.

(10) Patent No.: US 8,198,715 B2
(45) Date of Patent: Jun. 12, 2012

(54) MEMS DEVICE AND PROCESS

(75) Inventors: Richard Ian Laming, Edinburgh (GB); Colin Robert Jenkins, Edinburgh (GB)

(73) Assignee: Wolfson Microelectronics plc, Edinburgh (DE)

( * ) Notice: Subject to any disclaimer, the term of this patent is extended or adjusted under 35 U.S.C. 154(b) by 156 days.

(21) Appl. No.: 12/678,922

(22) PCT Filed: Sep. 18, 2008

(86) PCT No.: PCT/GB2008/003192
§ 371 (c)(1),
(2), (4) Date: May 6, 2010

(87) PCT Pub. No.: WO2009/037480
PCT Pub. Date: Mar. 26, 2009

(65) Prior Publication Data
US 2010/0237447 A1    Sep. 23, 2010

(30) Foreign Application Priority Data
Sep. 19, 2007   (GB) .................................. 0718307.2

(51) Int. Cl.
*H01L 23/02* (2006.01)

(52) U.S. Cl. ... 257/678; 257/52; 257/396; 257/E21.007; 257/E21.066; 257/E21.067; 257/E21.229; 257/E21.613

(58) Field of Classification Search .................. 257/678, 257/52, 54, 55, 57, 59, 63, 396, 643, E21.007, 257/E21.066, E21.067, E21.229, E21.613
See application file for complete search history.

(56) References Cited

U.S. PATENT DOCUMENTS

| 6,829,814 | B1 | 12/2004 | Freeman et al. |
| 6,847,090 | B2 | 1/2005 | Loeppert |
| 2002/0067663 | A1 | 6/2002 | Loeppert et al. |
| 2003/0016839 | A1* | 1/2003 | Loeppert et al. .............. 381/174 |
| 2003/0063762 | A1 | 4/2003 | Tajima et al. |
| 2006/0280319 | A1 | 12/2006 | Wang et al. |
| 2007/0160248 | A1 | 7/2007 | Sung |
| 2007/0201710 | A1 | 8/2007 | Suzuki et al. |

FOREIGN PATENT DOCUMENTS

WO    WO 02/15636 A2    2/2002

* cited by examiner

*Primary Examiner* — David Nhu
(74) *Attorney, Agent, or Firm* — Dickstein Shapiro LLP

(57) ABSTRACT

A MEMS transducer includes a substrate, a membrane layer and a back-plate layer. The membrane layer is supported by the substrate. The back-plate layer is supported by the membrane layer and includes a respective sidewall portion and a respective raised portion. One or more columns, separate from the sidewall portion of the back-plate layer, connect the back-plate layer, the membrane layer and the substrate.

17 Claims, 7 Drawing Sheets

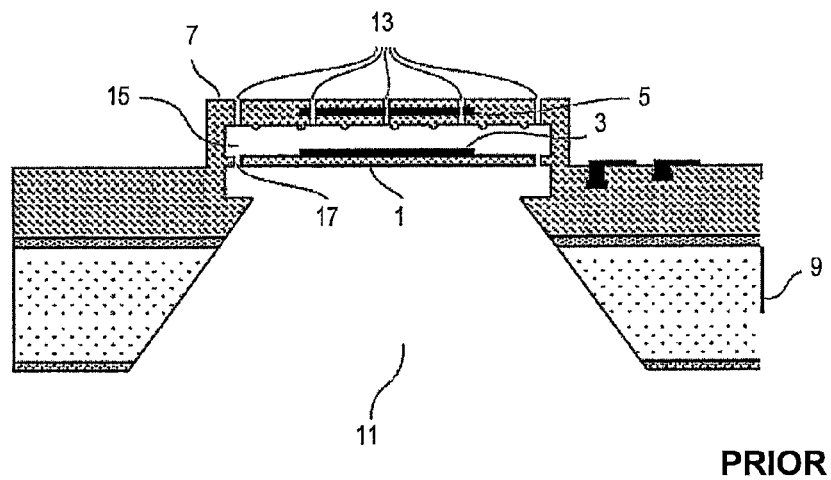
PRIOR ART
Figure 1
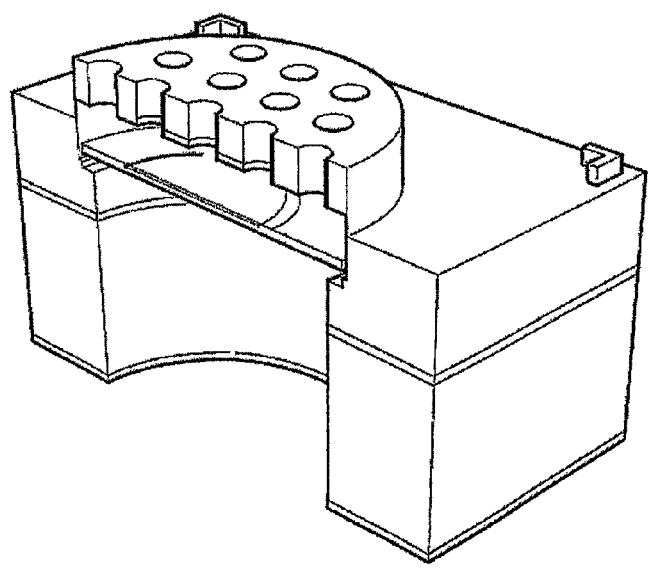
Figure 2    PRIOR ART

MEMS DEVICE AND PROCESS

This is a §371 national stage application of PCT/GB08/03192, filed Sep. 18, 2008.

This invention relates to the field of MEMS technology, and relates in particular, but not exclusively, to a MEMS device and a process for manufacturing that device.

BACKGROUND

Consumer electronics devices are continually getting smaller and, with advances in technology, are gaining ever-increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. It is therefore desirable to integrate functions of electronic circuits together and combine them with transducer devices such as microphones and speakers.

The result of this is the emergence of micro-electrical-mechanical-systems (MEMS) based transducer devices. These may be for example, capacitive transducers for detecting and/or generating pressure/sound waves or transducers for detecting acceleration. There is a continual drive to reduce the size and cost of these devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of transducers, the device is driven by a potential difference provided across the electrodes.

FIGS. 1 and 2 show a schematic diagram and a perspective view, respectively, of a known capacitive microphone device. The capacitive microphone device comprises a flexible membrane 1 that is free to move in response to pressure differences generated by sound waves. A first electrode 3 is mechanically coupled to the flexible membrane 1, and together they form a first capacitive plate of the capacitive microphone device. A second electrode 5 is mechanically coupled to a generally rigid structural layer or back-plate 7, which together form a second capacitive plate of the capacitive microphone device.

The capacitive microphone is formed on a substrate 9, for example a silicon wafer. A back-volume 11 is provided below the membrane 1, and is formed using a "back-etch" through the substrate 9. A plurality of openings 13, referred to hereinafter as acoustic holes, are provided in the back-plate 7 so as to allow free movement of air molecules, such that the sound waves can enter a cavity 15 above the membrane 1. A plurality of openings 17, hereinafter referred to as bleed holes, connect the cavity 15 with the back-volume 11. The cavity 15 and back-volume 11 allow the membrane 1 to move in response to the sound waves entering via the acoustic holes 13 in the back-plate 7.

Thus, in response to a sound wave corresponding to a pressure wave incident on the microphone, the membrane 1 is deformed slightly from its equilibrium position. The distance between the lower electrode 3 and the upper electrode 5 is correspondingly altered, giving rise to a change in capacitance between the two electrodes that is subsequently detected by electronic circuitry (not shown).

FIG. 2 shows a perspective view of the MEMS device illustrated in FIG. 1.

FIG. 3 shows a simplified cross-sectional view of a conventional MEMS device such as that shown in FIGS. 1 and 2. As mentioned above, a first electrode (not shown) forms part of the flexible membrane 1, and a second electrode (not shown) is attached to or embedded in the rigid back-plate 7 above the membrane 1. Both the back-plate 7 and the membrane 1 may be formed from silicon nitride, for example, and the substrate from silicon. However, the thermal expansion coefficient of silicon is greater than that of silicon nitride and this leads to stresses at the interface between the two dissimilar materials.

The structure of FIG. 3 is formed by various processes of depositing layers and then selectively dry or wet etching portions of the layers away again. These processes take place at relatively low temperatures (in the order of 10-400° C.). When the layers are deposited, there are no intrinsic stress concentrations in the structure. When the structure is released by removal of the sacrificial layers the tensile stress of the deposited layer causes a torsional moment in the membrane sidewall. This leads to a tensile stress concentration on the outer sidewall edge and a compressive stress concentration on the inner sidewall edge. A similar stress can be found in the membrane 1.

These stress concentrations tend to cause cracking originating at the points labelled A and B in FIG. 3, and can lead to failure of the MEMS device. This stress can also render the MEMS device more susceptible to failure during fabrication. For example, when multiple MEMS devices are fabricated on a single wafer and subsequently separated using a technique known as singulation or dicing, the stress at points A and B can cause the device to crack and fail. After failure at these points, the transducer is rendered useless.

It is therefore an aim of the present invention to provide a MEMS device that does not suffer from the disadvantages mentioned above.

SUMMARY OF INVENTION

According to a first aspect of the invention, there is provided a MEMS device comprising: a substrate; a membrane layer, supported by the substrate; a back-plate layer, supported by the membrane layer, said back-plate layer comprising a respective sidewall portion and a respective raised portion; and one or more columns separate from the sidewall portion of the back-plate layer, said columns connecting the back-plate layer, the membrane layer and the substrate.

According to a second aspect of the invention, there is provided a method for manufacturing a MEMS device, said MEMS device comprising a substrate, a membrane layer supported by the substrate, and a back-plate layer supported by the membrane layer. The method comprises the steps of: depositing a sacrificial layer on the substrate; removing the sacrificial layer from one or more selected positions, said selected positions defining the positions of one or more columns; and depositing the back-plate layer over the substrate.

BRIEF DESCRIPTION OF THE DRAWINGS

For a better understanding of the present invention, and to show more clearly how it may be carried into effect, reference will now be made, by way of example, to the following drawings, in which:

FIG. 1 shows a cross-sectional view of a prior art MEMS microphone;

FIG. 2 is a cross-sectional perspective view of the MEMS microphone shown in FIG. 1;

DETAILED DESCRIPTION

It is noted that the description of the invention will be made in connection with a MEMS transducer, and in particular a MEMS transducer in the form of a capacitor microphone. However, it is noted that the invention is not limited to MEMS transducers, and is applicable to any MEMS device.

Figure 3:
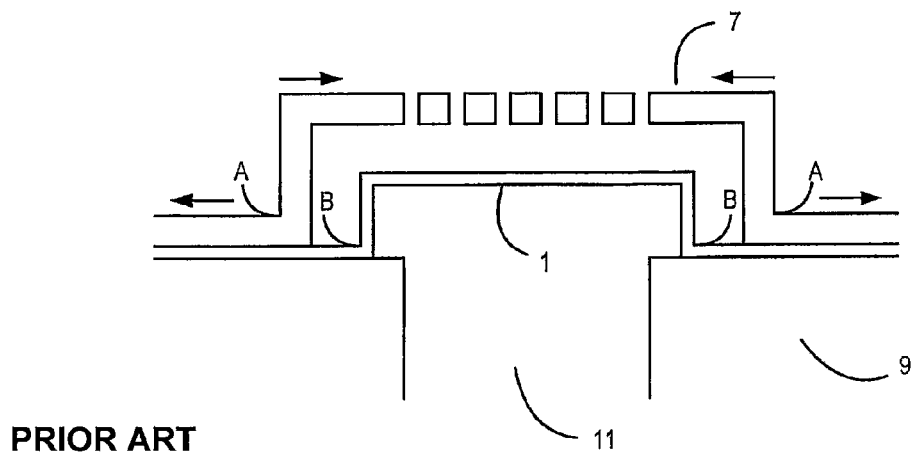
FIG. 3 is a simplified diagram showing a cross-sectional view of a basic MEMS structure.
Figure 4:
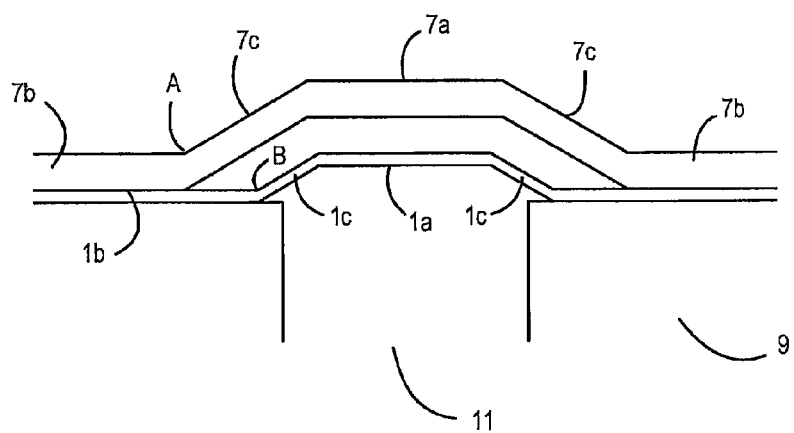
FIG. 4 is a perspective view of a MEMS device according to an embodiment of the present invention.

FIG. 4 shows a perspective view of a MEMS transducer 100 according to the present invention.

As is conventional, the transducer 100 comprises a back-plate 110 in which an electrode 112 is embedded. Not shown is a flexible membrane underneath the back-plate 110 which reacts to pressure waves. A second electrode is embedded in the membrane, and the changes in capacitance between the two electrodes used to detect the incoming pressure waves. The transducer 100 further comprises a plurality of acoustic holes 114 formed in the back-plate 110, in order that pressure waves can reach the membrane underneath the back-plate 110.

However, as mentioned above, the back-plate 110 is highly stressed, and this can cause cracking in the sidewalls. Therefore, according to the present invention, the transducer further comprises one or more columns 116 formed around the periphery of the back-plate 110. The columns 116 act to reduce the stress in the structure of the back-plate 110 by reducing the torsional moment in the sidewalls. The effect of the columns 116 is to create a "bridge structure" that is supported at two points, i.e. the columns and the base of the sidewalls.

In the embodiment shown in FIG. 4, the columns are circular, such that any stress built up around the columns 116 is evenly distributed. However, alternative shapes may be thought of by those skilled in the art without departing from the scope of the invention. In particular it is envisaged that any shape column will have some stress-reducing properties in the back-plate 110.

Figure 5:
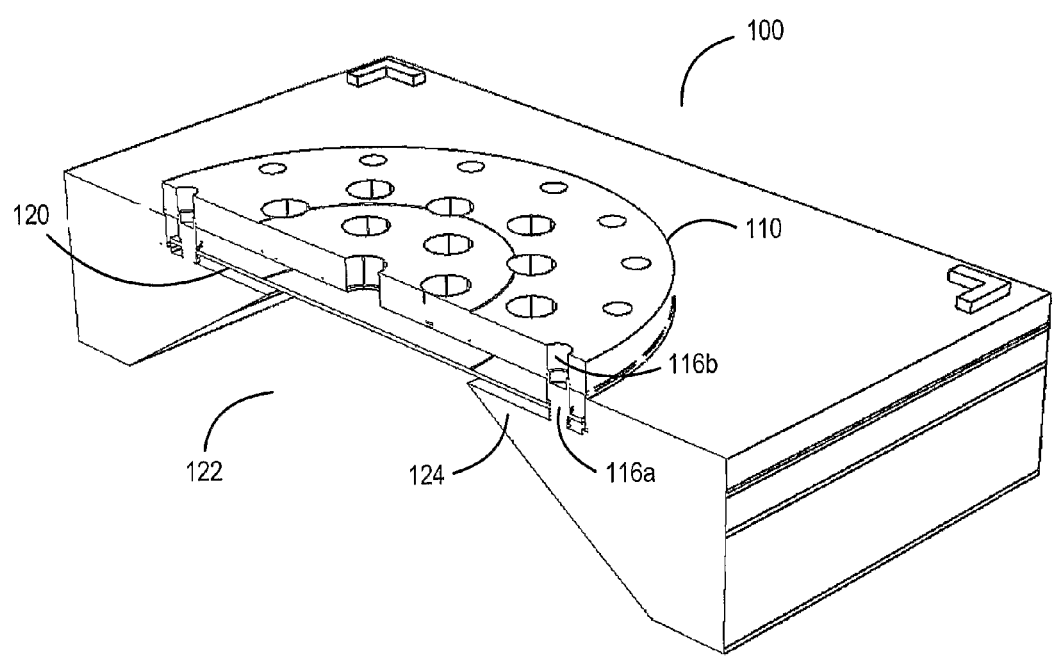
FIG. 5 is a cross-sectional view of the MEMS device of FIG. 4.

FIG. 5 is a distorted perspective view of a cross-section of the transducer 100.

The cross-section shows the presence of the flexible membrane 120 located underneath the back-plate 110. As is conventional, the membrane 120 is located over a back-volume 122 so that it is free to react to the changes in pressure caused by incident acoustic waves. The back-volume 122 is etched in a substrate 124 that supports the membrane 120 and the back-plate 110.

FIG. 5 also shows the columns 116 in more detail. As can be seen, in this embodiment, the columns are comprised of a first part 116a which is in contact with the substrate. In this embodiment, as will be explained in greater detail below with reference to FIGS. 8a to 8g, the first part 116a is formed by selectively depositing and patterning a sacrificial layer, and then depositing the back-plate 110 on top of the patterned sacrificial layer. The back-plate layer itself then forms the first part 116a of the columns. Thus, in this embodiment, the columns 116 also comprise a second part 116b above the first part 116a which is the absence of the back-plate 110. It will be appreciated that the reference made above to the first part 116a being in contact with the substrate does not necessarily imply that the two features are in direct contact. For example, one or more other layers may be interposed between the substrate and the first part 116a of the column.

Figure 6:
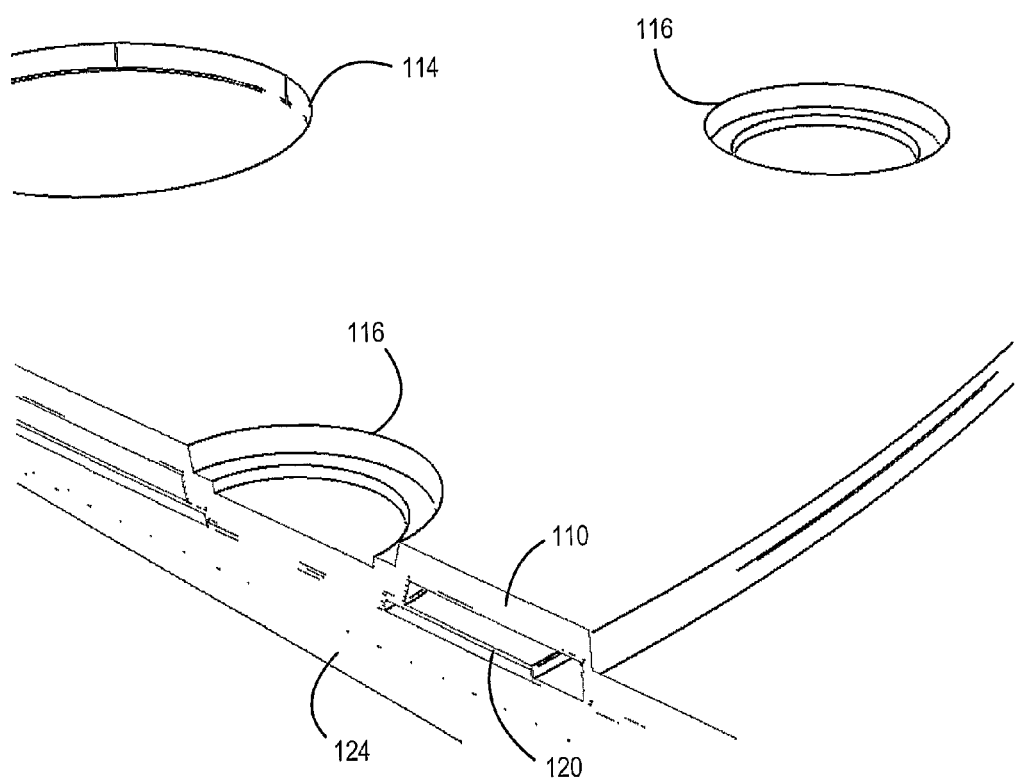
FIG. 6 is a perspective view of a portion of the MEMS device shown in FIGS. 4 and 5.

FIG. 6 is a perspective cross-section showing the columns 116 in yet more detail. As a consequence of the manufacturing process, the walls of the columns 116 have a stepped profile. Further, the steps of the walls are not vertical, but rather sloped slightly. Both the steps and the sloping nature of the walls of the columns 116 give additional support to the back-plate 110.

The columns 116 are advantageous over a large range of dimensions. However, certain dimensions lead to the most effective amount of stress relief in the sidewalls of the back-plate 110. For example, for a transducer diameter of 1 mm, column widths of about 12 μm and spacing from the sidewall of about 10 μm give the most effective relief. An optimal stress relief is also found when the column widths are approximately equal to column separation. Again for the example of a transducer diameter of 1 mm, 144 columns equally spaced around the periphery of the transducer results in a centre-to-centre column separation of approximately 22 μm (i.e. for columns widths of 12 μm, the edge-to-edge column separation is about 10 μm). For alternative transducer diameters, the optimal column widths and spacings will in general vary.

Figure 7:
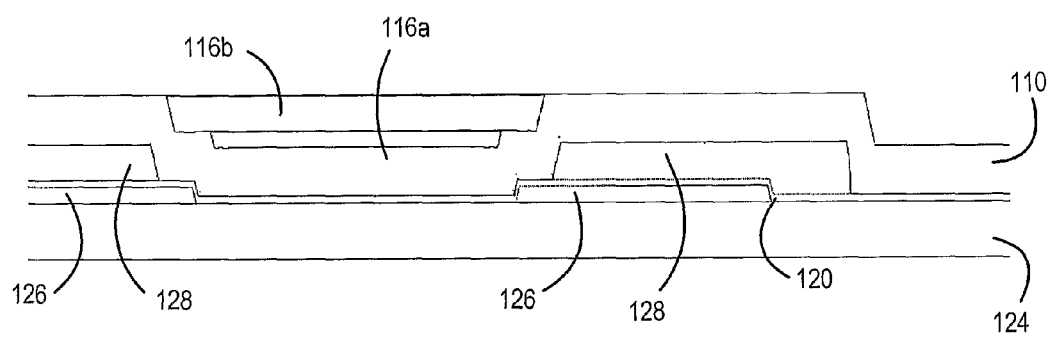
FIG. 7 is a cross-sectional view of the portion shown in FIG. 6.

FIG. 7 is a horizontal cross-section of a column 116.

The column 116 is formed on a substrate 124. A membrane layer 120 is formed on the substrate 124. The membrane layer 120 generally comprises a raised portion formed over a gap 126. However, at the site of the column 116a, the membrane layer 120 forms part of the column 116a, and is in contact with the substrate 124. The gap 126 may be formed by depositing one of the layers of the MEMS transducer, for example an etch stop layer, such as an etch stop polyimide, and then etching that layer away to release the membrane layer 120 from the substrate 124. In other words, when depositing the etch stop layer the etch stop layer is patterned to leave spaces around the periphery of the device at the sites of the columns 116 (described in greater detail in FIGS. 8a to 8g below), such that the subsequent depositing of the membrane layer results in corresponding dips in order to form the columns 116. A back-plate layer 110 is formed above the membrane layer 120. The back-plate layer 110 also comprises a raised portion such that a gap 128 is formed between the back-plate layer 110 and the membrane layer 120.

Thus, in the above-described embodiment, the column 116 is formed by the back-plate layer 110 in conjunction with the membrane layer 120. It will be appreciated by one skilled in the art that FIG. 7 shows only one cross-section through a column 116 near the periphery of the back-plate 110. As seen in FIG. 6, a majority of cross-sections through a MEMS transducer would not pass through a column 116. That is, FIG. 7 shows two portions labelled 126, and two portions labelled 128. As FIG. 7 is a cross-section, the two gaps labelled 126 are in fact part of the same gap underneath the membrane layer 120—they are linked to one another into and out of the plane of the diagram around the column 116; similarly for the two portions labelled 128. The invention leads to the edge of the "active" area of the membrane being defined by the columns, rather than the edge of an etch stop as defined by the prior art.

FIGS. 8a to 8g show steps in a process of manufacturing a column 116 of a transducer according to the present invention.

Figure 8A:
FIGS. 8a to 8g show an example of a process for fabricating the MEMS device of FIGS. 4 to 7.

FIG. 8a shows a substrate 124. The substrate 124 may be silicon, or any other suitable material.

Figure 8B:
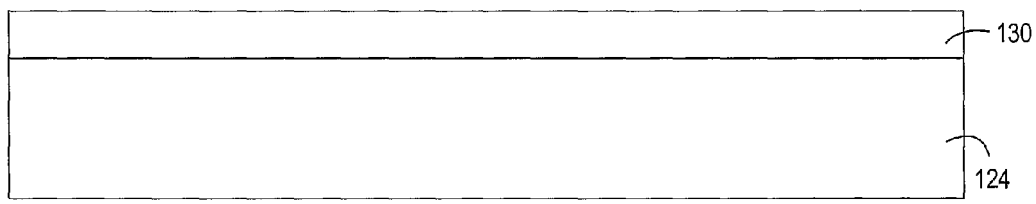

A first step in the process is to deposit a layer 130 on to the substrate 124 (see FIG. 8b). For example, the layer 130 may be an etch stop layer, for example an etch stop polyimide.

Figure 8C:
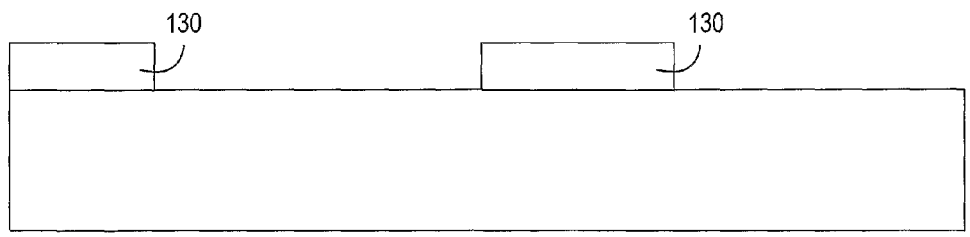

A next step in the process is to pattern the polyimide layer 130 appropriately (see FIG. 8c). The polyimide layer 130 is patterned such that one or more spaces are left on the substrate 124 at selected points around the device, these points defining the positions of the columns 116. FIG. 8c shows two portions, both labelled as the polyimide layer 130. However, in reality these portions are connected out of the plane of the cross-section. In other words, the gap shown between the portions 130 in FIG. 8c is effectively a circle in plan view (or other shape for a differently shaped column).

The patterning may take place through dry or wet etching, or any other process that appropriately removes the polyimide layer 130 without damaging the device.

Figure 8D:
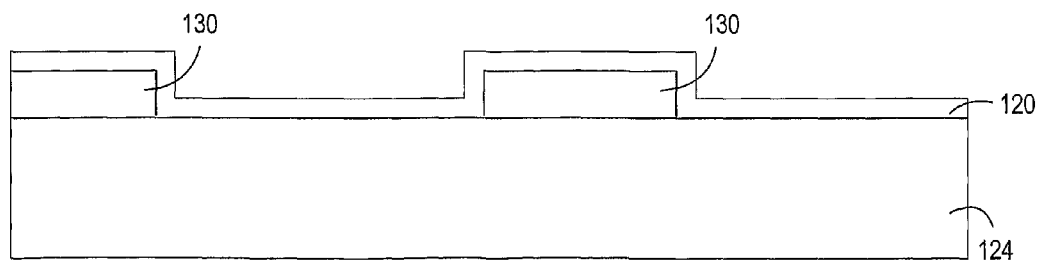

A next step in the process is to deposit the membrane layer 120 (see FIG. 8d). The membrane layer 120 may be silicon nitride or any other suitable material. As afore-mentioned, the membrane layer 120 must be flexible enough to respond to acoustic waves, but strong enough not to sag in the middle of the device.

Optionally, the membrane layer 120 may be patterned to form small "release" holes above the area of polyimide layer 130 between the column 116 and the prospective position of the sidewall of the back-plate layer 110. The release holes would allow etchant to flow more easily to the area of the polyimide layer between the column and the sidewall, such that the polyimide layer is removed more effectively.

Figure 8E:
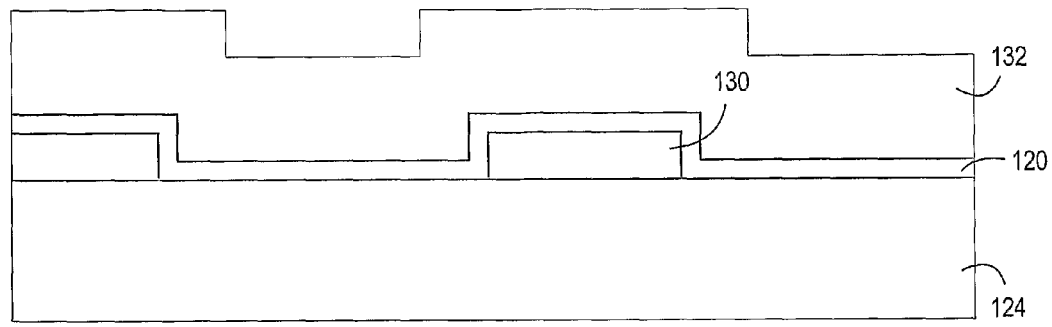

A next step in the process is to deposit a sacrificial layer 132, for example a polyimide layer 132 on top of the membrane layer 120 (see FIG. 8e). The sacrificial layer 132 conforms to the shape of the membrane layer 120 underneath.

Figure 8F:
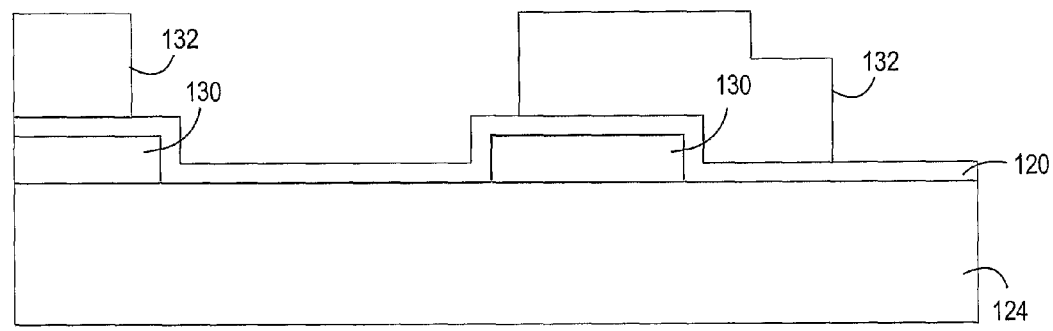

In FIG. 8f, the sacrificial polyimide layer 132 is patterned, such that the sacrificial polyimide layer 132 forms a stepped structure, the stepped structure forming the subsequent stepped structure in the back-plate 110. The patterning involves removing the sacrificial polyimide layer 132 from the locations that have been marked for columns, i.e. substantially the positions in which the first etch stop polyimide layer 130 was etched away.

Figure 8G:
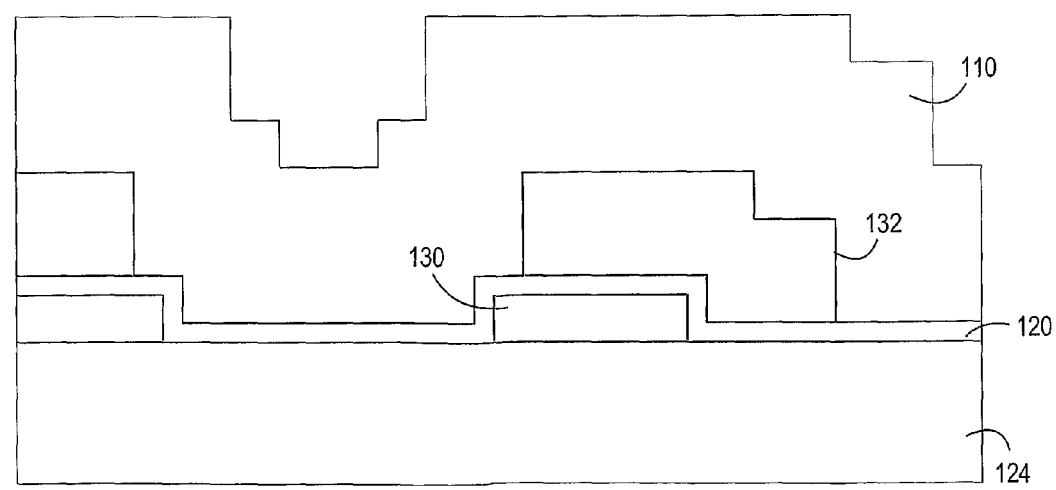

A next step of the process is to deposit the back-plate layer 110 (see FIG. 8g). The back-plate 110 acts as a fixed reference against which the displacement of the membrane layer 120 varies. Therefore the back-plate layer 110 must be as rigid as possible, and so is thicker than the membrane layer 120. As can be seen, the back-plate layer 110 fills the recess left by the patterning of the two polyimide layers 130, 132, and forms the column in conjunction with the membrane layer 120. The back-plate layer 110 may be silicon nitride or any other suitable material familiar to those skilled in the art.

Optionally, the back-plate layer 110 may be patterned to form small "release" holes above the area of polyimide layer 132 between the column 116 and the position of the sidewall of the back-plate layer 110. The release holes would allow etchant to flow more easily to the area of the polyimide layer between the column and the sidewall, such that the polyimide layer is removed more effectively.

As a final step (not shown), the remains of the polyimide layers 130, 132 are etched away, so that the membrane 120 is free to move relative to the back-plate 110. The etchant (possibly a gas or a liquid) flows though the acoustic holes 114 and/or the release holes mentioned above to etch away the remaining polyimide layers 130, 132 and create the gaps 126, 128 respectively.

An alternative to the above-described embodiments is a transducer with a substantially flat membrane layer. That is, the membrane layer does not comprise a raised portion, and instead lies substantially flat over the substrate. In this embodiment, the only "active" part of the membrane is that which directly overlies the back-volume and is therefore free to move in response to oncoming pressure waves, etc. In this embodiment, the columns may be formed solely by the back-plate layer.

It is noted that the invention may be used in a number of applications. These include, but are not limited to, consumer applications, medical applications, industrial applications and automotive applications. For example, typical consumer applications include laptops, mobile phones, PDAs and personal computers. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfill the functions of several units recited in the claims. Any reference signs in the claims shall not be construed so as to limit their scope.

The invention claimed is:

1. A MEMS transducer, comprising:
a substrate;
a membrane layer, supported by the substrate;
a back-plate layer, supported by the membrane layer, said back-plate layer comprising a respective sidewall portion and a respective raised portion; and
one or more columns separate from the respective sidewall portion of the back-plate layer, said columns connecting the back-plate layer, the membrane layer and the substrate.

2. A MEMS transducer as claimed in claim 1, wherein said columns comprise the back-plate layer.

3. A MEMS transducer as claimed in claim 1, wherein said membrane layer comprises a respective sidewall portion and a respective raised portion.

4. A MEMS transducer as claimed in claim 3, wherein said columns comprise the membrane layer and the back-plate layer.

5. A MEMS transducer as claimed in claim 1, wherein said columns have sloped walls.

6. A MEMS transducer as claimed in claim 1, wherein said columns have stepped walls.

7. A MEMS transducer as claimed in claim 1, wherein said columns are substantially circular.

8. A MEMS transducer as claimed in claim 1, wherein said columns are formed around the periphery of the back-plate layer and the membrane layer.

9. A communications device comprising a micro-electrical-mechanical system (MEMS) transducer as claimed in claim 1.

10. A portable telephone device comprising a micro-electrical-mechanical system (MEMS) transducer as claimed in claim 1.

11. A portable telephone device as claimed in claim 10, wherein the MEMS transducer is used in a noise-cancellation process.

12. An audio device comprising a micro-electrical-mechanical system (MEMS) transducer as claimed in claim 1.

13. An audio device as claimed in claim 12, wherein the MEMS transducer is used in a noise-cancellation process.

14. A computer device comprising a micro-electrical-mechanical system (MEMS) transducer as claimed in claim 1.

15. A vehicle comprising a micro-electrical-mechanical system (MEMS) transducer as claimed in-claim 1.

16. A medical device comprising a micro-electrical-mechanical system (MEMS) transducer as claimed in any claim 1.

17. An industrial device comprising a micro-electrical-mechanical system (MEMS) transducer as claimed in claim 1.

* * * * *